United States Patent [19]

Wieland et al.

[11] Patent Number: 5,302,495
[45] Date of Patent: Apr. 12, 1994

[54] METHOD FOR THE PHOTOLITHOGRAPHIC PRODUCTION OF STRUCTURES ON A SUPPORT

[75] Inventors: Rainer Wieland, Grasbrunn; Wilfried Houben, Munich, both of Fed. Rep. of Germany

[73] Assignee: Mannesmann Aktiengesellschaft, Dusseldorf, Fed. Rep. of Germany

[21] Appl. No.: 780,156

[22] Filed: Oct. 21, 1991

[30] Foreign Application Priority Data

Oct. 19, 1990 [DE] Fed. Rep. of Germany ....... 4033294

[51] Int. Cl.$^5$ ................................................ G03F 7/26
[52] U.S. Cl. ................................... 430/330; 430/322; 430/325; 430/394
[58] Field of Search ............... 430/322, 325, 330, 961, 430/394, 396

[56] References Cited

U.S. PATENT DOCUMENTS

| | | | |
|---|---|---|---|
| 4,609,427 | 9/1986 | Inamoto | 430/313 |
| 4,649,100 | 5/1987 | Leyrer | 430/330 |
| 4,666,823 | 5/1987 | Yokota | 430/330 |
| 4,883,730 | 11/1989 | Ahne | 430/330 |
| 4,885,232 | 12/1989 | Spak | 430/330 |

*Primary Examiner*—Marion E. McCamish
*Assistant Examiner*—Kathleen Duda
*Attorney, Agent, or Firm*—Cohen, Pontani, Lieberman & Pavane

[57] ABSTRACT

The present invention relates to a method for the photolithographic production of structures on a support, in particular, the production of structures of the ink feed channels for ink jet heads of ink jet printers, in which the support is provided with a dry-film resist. The object of the invention is to obtain a high steepness of the flank of the structures. This object is achieved in the manner that the support, together with the dry-film resist, is subjected to a brief exposure corresponding to the intended structuring, followed by a rapid heating of the support.

7 Claims, 2 Drawing Sheets

~ 80μm

~ 60μm

~ 35μm

~ 30μm

METHOD FOR THE PHOTOLITHOGRAPHIC PRODUCTION OF STRUCTURES ON A SUPPORT

FIELD OF THE INVENTION

The present invention relates to a method for the photolithographic production of structures on a support, in particular, the production of the ink guide channel structures of ink jet heads for use in ink jet printers, in which the support is provided with a dry-film resist.

BACKGROUND OF THE INVENTION

The production of structures on supports or substrates requires a high degree of accuracy, particularly when, as in the case of ink printheads, the channels and/or the webs lying between them are located close together, in order to obtain the smallest possible structural size. Present printing technology requires a print resolution in excess of about 180 dots per inch, and possibly about 360 dots per inch. A ink jet printhead for use in such a printer must have a channel placement accuracy equal or better than the dot pitch, and if used in a single pass over the recording medium, must have a pitch equal to the intended dot pitch.

The prior art teaches the production of structures by the silk screen technique or by etching of a surface layer, in order to obtain the desired structure. The high degree of precision required is, however, not always assured thereby, particularly when a high flank or wall steepness of the applied structures is important in order to obtain a resulting printhead capable of high resolution printing. Thus, an imprecise production method may result in poor production yield, and/or printheads that clog easily, have inconsistent flow or are otherwise suboptimal.

A photolithographic method is also known for the production of structures on supports. For this purpose, a support is provided with a dry-film resist coating a surface of a substrate, which is selectively exposed to radiation at the places which, after development, are subsequently to form the elevations, i.e. the regions remaining between the ink channels, in the case of ink printheads. Thus, after developing the latent image produced by the irradiation, a relief pattern is formed on the substrate, where the dry film resist, after exposure, is stabilized and is not removed by the development process.

The dry film resist, in unexposed condition, is a tacky composition which is generally covered by a protective foil or covering layer. If such an arrangement is now exposed, parts of the light are deflected, dispersed or reflected by the protective foil so that after the development process, the side walls formed are only approximately perpendicular to the surface of the support, thus reducing the precision of the resulting structure.

An improvement over this method is obtained by omitting the protective foil, since this serves to reduce light dispersion.

Methods of forming ink channels in ink jet printheads by photopolymerizing a photosensitive polymer are disclosed in U.S. Pat. Nos. 4,789,425; Re. 32,572; 4,727,012; 4,698,645; 4,666,823; 4,609,427; 4,509,063; 4,417,251; 4,412,224; and 4,394,670, which are incorporated herein by reference. Such a method is also disclosed in Japanese Laid-open Publication No. 43876/1982, which is incorporated herein by reference.

OBJECTS OF THE INVENTION

It is an object of the present invention to treat a support coated with a dry-film resist in such a manner that in the edges of the raised plateaus forming flanks after a development process have improved steepness.

This object is achieved in the manner that the support, together with the dry resist, is selectively subjected to a brief exposure of an irradiating beam, corresponding to the intended structuring, followed by a rapid heating of the support. The substrate is preferably heated to about 80°–150° C. for about 20–60 seconds about 60 seconds after exposure, by exposure to infrared radiation or by proximity to a hotplate.

It is another object of the present invention to provide a method wherein prior to exposing the dry film resist, provided with a protective film, the resist is pre-exposed on an edge region thereof, outside a useful surface for the production of structures, and then removing the protective foil prior. The unprotected resist is then selectively exposed to radiation and heated prior to development.

It is a still further object of the present invention to provide a method for assuring accurate focus and alignment of exposure apparatus by pre-exposing, in addition to the edge region, selected points on the dry film resist to form alignment pads which allow the exposure apparatus to contact the coated substrate during exposure. These selected points may be on the periphery of the substrate.

SUMMARY OF THE INVENTION

By briefly illuminating and subsequently rapidly heating the dry film resist, the resulting flanks produced after development are prevented from migrating into each other so that steeper flanks can be obtained.

Practically vertical flanks can be obtained if the exposure is effected with filtered light. The wavelength of the light must be adapted in this connection to the spectral sensitivity of the dry resist. It should, of course, be realized that a monochromatic light source, such as a laser, could be used for exposure, which would also provide the aforementioned advantage of practically vertical flanks. In addition, other exposure methods, adapted to the dry film resist, could be employed in the present invention.

It has been found to be preferable for the wafer to be heated to about 80° to 150° C. for about 20 to 60 seconds commencing about 60 seconds after the exposure. The thickness of the dry-film resist is, in this case, about 50 μm. Of course, if the thickness or other parameters of the resist were altered, the process could be defined to achieve the advantages of the present invention.

The heating is preferably effected by infrared irradiation or a hotplate. In the case of infrared irradiation, an infrared light source could be located in the photoresist exposure chamber, and could be adapted to heat the dry film resist through the optical mask. In the case of a hot plate, the substrate would be located on a heatable surface, which is rapidly heated subsequent to exposure. The substrate could also be moved after exposure onto a heatable or preheated hotplate. Other heating methods are known, and could be employed. The temperature of the heating process could be monitored in known manner, or the parameters of the heating process predetermined so that no feedback is necessary. In addition, the heating procedure could be continually optimized in order to achieve the best actual result after development.

The dry-film resist is, in principle, covered with a protective foil. Since the resist is tacky in an unexposed state, the protective foil adheres very strongly to it. This has the result that upon the removal of the foil, regions of the edge of the unexposed resist are lifted off, which, of course, is undesired, and reduces the yield. An improvement can be obtained by providing the substrate coated with dry film resist, forming wafer with a protective foil prior to the selective exposure for forming the functional structure, pre-exposing the wafer on its edge region, outside the useful area for the production of structures and then removing the protective foil.

Since the resist is hardened in its exposed state, the protective foil can easily be withdrawn due to the lesser adhesiveness in this region.

In order to be able to establish a precise distance and alignment of the surface of the dry-film resist from the exposure device, it is preferable for further selected points, in the region of the edge of the wafer, to be pre-exposed, in addition to the aforementioned edge exposure. These points then serve as points of support for the exposure device. The exposure of these support points prehardens the surface, allowing the exposure apparatus to contact the wafer during exposure.

BRIEF DESCRIPTION OF THE DRAWINGS

The invention will be described in further detail below with reference to the figures shown in the drawings, in which.

DETAILED DESCRIPTION OF THE DRAWINGS

Figure 1:
FIGS. 1 to 7 show in principle, the photolithographic method for the production of the ink channels in ink jet printerheads according to the present invention.
Figure 2:
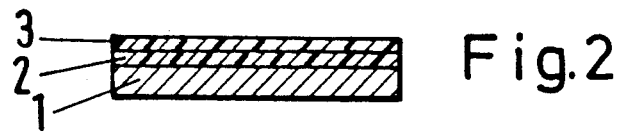
Figure 3:
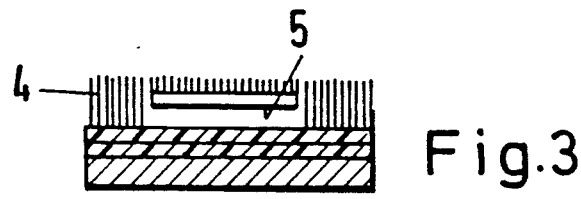
Figure 4:
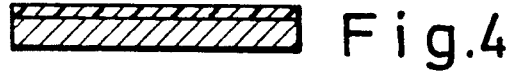
Figure 5:
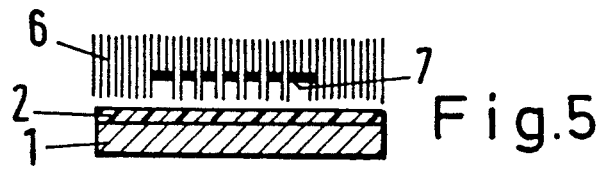
Figure 6:
Figure 7:
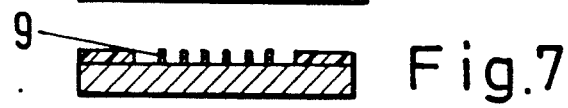

The method steps shown in FIGS. 1 to 7 show a silicon substrate 1 which is provided on one side with a dry-film resist 2 and a protective foil 3. FIG. 3 shows an exposure device with a mask 5. As shown in the step represented by this figure, the edge regions are exposed. This exposure is then followed, in accordance with FIG. 4, by the removal of the protective foil. The next step is the actual production of the ink channels. For this purpose, as shown in FIG. 5, further exposure is effected by an exposure device producing an irradiation beam 6 and a mask 7. This method step is followed, as shown in FIG. 6, by heating with infrared radiation 8. After a development step, the exposed regions 9 remain, while the unexposed regions are removed in the development process, as shown in FIG. 7. After the unexposed resist is washed away, a final cleaning process comprising reactive ion etching can be carried out in order to remove development residues.

A development process may be, for example, removing the nonphotopolymerized resist by immersion in a volatile organic solvent, such as trichloroethane.

Figure 8:
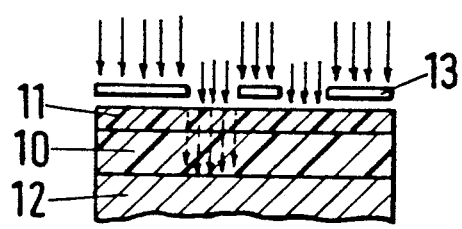
FIGS. 8 and 9 show the construction of structures according to the prior art.
Figure 9:
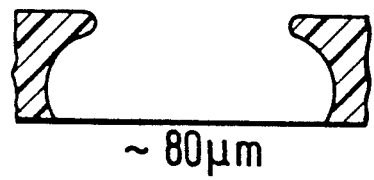

FIGS. 8 and 9 show the customary production of structures in accordance with the prior art. The substrate 12 provided with the dry-film resist 10 and the protective foil 11 is exposed by an exposure device provided with a mask 13. The course of the light rays is indicated by arrows. As a result, a structure of the channels, such as shown in FIG. 9, can be obtained. The flanks are rounded and hollowed so that an average channel width of about 80 μm results.

Figure 10:
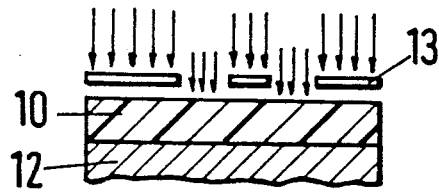
FIGS. 10 to 13 show in principle the construction of the inkjet channels in inkjet printheads by different methods according to the present invention.
Figure 11:
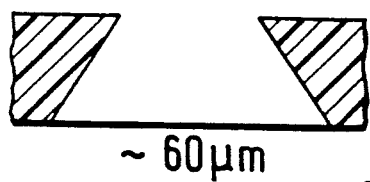

In accordance with FIG. 10, the protective foil is removed before the exposure for the structuring of the ink channels. In this way, the light impinging on the resist 10 is not deflected, reflected or refracted by the protective foil or film so that a structure, such as shown in FIG. 11 results. The average resulting channel width according to such a process is about 60 μm. The course of the flanks is straighter than that which results from the process depicted in FIGS. 8 and 9.

Figure 12:
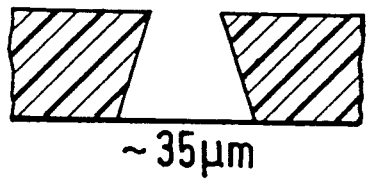

If a brief exposure followed by rapid heating is effected in accordance with the present invention, then a structure in accordance with FIG. 12 is obtained.

Figure 13:
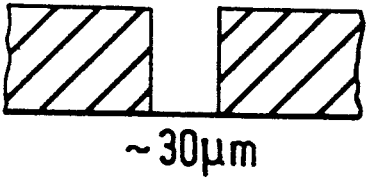

Practically vertical flanks, such as shown in FIG. 13, are obtainable if the exposure is effected with a chromatic exposure light filter. The average resulting channel width is then only about 30 μm.

Figure 14:
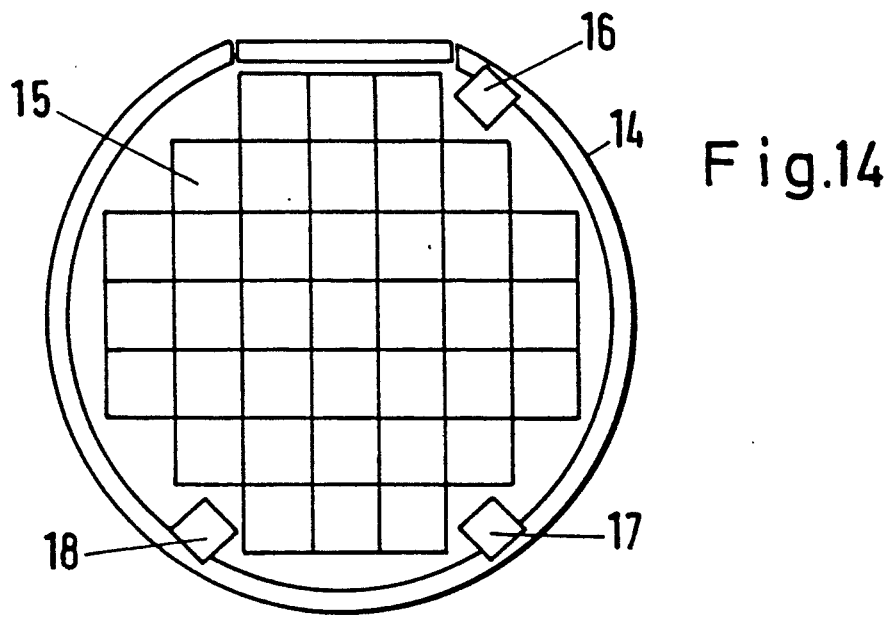
FIG. 14 is a diagram explaining the edge exposure of the present invention.

FIG. 14 shows a wafer which is pre-exposed in the region of its edge 14. This procedure corresponds the procedure described with respect to FIG. 4, described above. Exposure in the region of the edge produces the result that the protective foil can easily be removed without deforming the unexposed remainder of the resist. The useful surface of the wafer, consisting of a plurality of substrates 15, is contained within the edge region 14. Simultaneously with the exposure of the edge region 14, the points 16, 17 and 18 are exposed. These points form the supports for the exposure device, whose so-called "proximity balls" or contact alignment means rest thereon assuring accurate photolithography. Since after the exposure, these points are hard in the same way as the region of the edge, a flat equalization plane between the plane of the wafer and the exposure device is possible.

Examples of solid photosensitive composition are those photosensitive resin films manufactured and sold by DuPont de Nemour & Co. under tradenames of Permanent Photopolymer Coating RISTON, photosensitive acrylic resin compositions such as Solder Mask 730S, Solder Mask 740S, Solder Mask 730FR, Solder Mask 740FR, Solder Mask SM1, produced by Du Pont Co., and PHOTEC 210R, 218R, 215, 3010, 3020, 860A-25, 860AFT, 140FT, SR-1000, SR-2000 and SR-3000, produced by Hitachi Kasei Co., and the like, all of which are commercially available. Besides these, there are various other kinds of photosensitive compositions used in the field of ordinary photo-lithography such as photosensitive resins, photo-resists, etc., examples of which are: diazo-resin; p-diazo-quinone; photo-polymerization type photo-polymers using, for example, a vinyl monomer and a polymerization initiator; dimerization type photo-polymers using polyvinyl cinnamate, etc. and a sensitizing agent; a mixture of o-naphthoquinone diazide and a Novolac type phenolic resin; a mixture of polyvinyl alcohol and a diazo resin; polyether type photo-polymers obtained by copolymerization of 4-glycidylethylene oxide with benzophenone, glycidylchalcone, or the like; copolymer of N,N-dimethylmethacryl amide and, for example, acrylamide benzophenone; unsaturated polyester type photosensitive resins such as APR (product of Asahi Kasei Kogyo K.K., Japan), TEBISUTA, TEVISTA (products of Teijin K.K., Japan), SONNE (product of Kansai Paint K.K., Japan), and the like; unsaturated urethane oligomer type photosensitive resins; photosensitive compositions composed of a photo-polymerization initiator, a polymer, and a bifunctional acryl monomer; dichromate type photo-resists; non-chromium type water-soluble photo-resists; polyvinyl cinnamate type photo-resists; cyclized rubber-azide type photo-resists, and so forth. In addition, AZ series (product of Shiysley) and OMR series (product of Oka, Tokyo, Japan) products are also of the class mentioned.

It should be understood that the preferred embodiments and examples described herein are for illustrative purposes only and are not to be construed as limiting the scope of the present invention, which is properly delineated only in the appended claims.

What is claimed is:

1. A method for the photolithographic production of a relief structure on a support, comprising the steps of:
    preexposing to radiation an edge region of a substrate which is provided with a dry film resist on its surface and a protective film on the dry film resist, the edge region surrounding a useful substrate surface area;
    removing the protective film;
    exposing the dry film resist of the useful substrate surface area surrounded by the edge region to radiation in a pattern corresponding to an intended structure;
    heating the exposed dry film resist; and
    processing the substrate to remove unexposed portions of the dry film resist.

2. The method according to claim 1, wherein said step of exposing the useful substrate surface area comprises providing a source of light producing a light beam, filtering the light beam, and exposing the dry film resist with the filtered light beam.

3. The method according to claim 1, wherein said heating step comprises heating substrate and dry film resist to about 80°-150° C. for about 20-60 seconds about 60 seconds after exposure.

4. The method according to claim 1, wherein heating is effected by infrared radiation.

5. The method according to claim 1, wherein heating is effected by placing the substrate on a hot plate.

6. The method according to claim 1, wherein the dry film resist has an initial thickness of about 50 micrometers.

7. A method for the photolithographic production of a relief structure on a support, comprising the steps of:
    simultaneously pre-exposing to radiation an edge region of a substrate and selected points of the substrate, the substrate being provided with a dry film resist on its surface and a protective film on the dry film resist, the edge region surrounding a useful substrate surface area and selected points of the substrate located between the edge region of the substrate and the useful substrate surface area;
    removing the protective film;
    exposing the dry film resist of the useful substrate surface area surrounded by the edge region to radiation in a pattern corresponding to an intended structure;
    heating the exposed dry film resist; and
    processing the substrate to remove unexposed portions of the dry film resist.

* * * * *